(12) United States Patent
Kim et al.

(10) Patent No.: US 6,448,179 B2
(45) Date of Patent: Sep. 10, 2002

(54) METHOD FOR FABRICATING SEMICONDUCTOR DEVICE

(75) Inventors: Jeong Ho Kim; Yu Chang Kim, both of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/860,769

(22) Filed: May 21, 2001

(30) Foreign Application Priority Data

May 24, 2000 (KR) .............................. 00-28009

(51) Int. Cl.$^7$ ............................... H01L 21/44
(52) U.S. Cl. ............... 438/672; 438/671; 438/244; 438/239
(58) Field of Search ................. 438/672, 239, 438/241, 675, 671

(56) References Cited

U.S. PATENT DOCUMENTS

| | | | | | |
|---|---|---|---|---|---|
| 5,893,734 A | * | 4/1999 | Jeng et al. | ................... | 438/239 |
| 5,895,239 A | * | 4/1999 | Jeng et al. | ................... | 438/239 |
| 6,001,685 A | * | 12/1999 | Kim | ........................... | 438/265 |
| 6,020,233 A | * | 2/2000 | Kim | ........................... | 438/240 |
| 6,121,086 A | * | 9/2000 | Kuroda et al. | .............. | 438/256 |
| 6,274,425 B1 | * | 8/2001 | Park | ........................... | 438/241 |

* cited by examiner

*Primary Examiner*—David Nelms
*Assistant Examiner*—Thao Le
(74) *Attorney, Agent, or Firm*—Pillsbury Winthrop LLP

(57) ABSTRACT

The present invention discloses a method for fabricating a semiconductor device. In particular, methods of the present invention produces a contact plug which is larger than the presumed contact region. As a result, the acceptable process error margin for misalignment is increased, and the property and the yield of semiconductor devices are improved.

19 Claims, 3 Drawing Sheets

METHOD FOR FABRICATING SEMICONDUCTOR DEVICE

FIELD OF THE INVENTION

The present invention relates to a method for fabricating a semiconductor device. In particular, the present invention relates to a method for preventing or significantly reducing the incidents of damaging active regions of a semiconductor substrate comprising a contact plug due to misalignment during its fabrication.

BACKGROUND OF THE INVENTION

Developments in techniques for forming a fine pattern on a semiconductor substrate have led to an increased use of highly integrated semiconductor devices. To form a semiconductor with a fine pattern requires a photoresist film mask with a correspondingly miniaturized pattern for etching and/or ion implantation.

In general, the resolution (R) of a photoresist film pattern is proportional to the light wavelength ($\lambda$) and the process variable ($\lambda$) of a micro exposure device. The resolution, however, is inversely proportional to the numerical aperture (NA) of the light exposure device, i.e., $R=k\times\lambda/NA$. Thus, one can improve the resolution (i.e., reduce the value of R) by decreasing the light wavelength, for example, the resolution of G-line ($\lambda$=436 nm) and i-line ($\lambda$=65 nm) micro exposure devices are about 0.5 $\mu$m and 0.3 $\mu$m, respectively. A photoresist film pattern below 0.3 $\mu$m typically requires a deep ultraviolet (DUV) light exposure device which generates a small wavelength length, for example, a KrF laser (248 nm) or an ArF laser (193 nm).

Other methods for improving the photoresist pattern resolution include using a phase shift mask as a photo mask; using a contrast enhancement layer (CEL) method to form a thin film to enhance an image contrast on a wafer; using a tri-layer resist TLR) method which positions an intermediate layer, such as a spin on glass (SOG) film, between two photoresist films; and using a silylation method to selectively implant a silicon into the upper portion of a photoresist film.

In a highly integrated semiconductor device, typically the size of a contact hole connecting the upper and lower conductive interconnections and the space between the contact hole and the adjacent interconnection are smaller relative to a less integrated semiconductor device. In addition, the aspect ratio of the contact hole in a highly integrated semiconductor device is typically higher than a less integrated semiconductor device. Thus, a highly integrated semiconductor device having a multi-layer conductive interconnection requires a precise mask alignment during its fabrication process, which reduces the process margin, i.e., acceptable error limit. Therefore, to maintain a space between contact holes, in conventional processes masks are formed with consideration to misalignment tolerance, lens distortion in the exposure process, critical dimension variation in the mask formation and photoetching processes, and mask registrations.

A self aligned contact (SAC) method has also been used in a contact hole formation process to overcome some of the disadvantages of lithography processes. The SAC method typically uses a polysilicon, a nitride, or an oxide nitride material as an etch barrier film. Of these, a nitride material is most often used as an etch barrier film.

In a conventional SAC method, a substructure, for example, a device isolation insulation film, a gate insulation film, and a metal-oxide semiconductor field effect transistor (MOSFET) comprising a gate electrode overlapped with a mask oxide film pattern and source/drain regions, is formed on a semiconductor substrate, and an etch barrier film and an interlayer insulation film comprising an oxide are formed over the substructure. A photoresist film pattern of a storage electrode contact and/or a bit line contact is formed by exposing the interlayer insulation film. The resulting interlayer insulation film is dry-etched to expose the etch barrier film. And a contact hole is produced by etching the etch barrier film.

Unfortunately, if the design rule is small, active regions of the semiconductor substrate are exposed during the SAC method due to a resolution deficiency of the lithography process and/or misalignment of the mask. Generally, the photoresist film mask, which is used to protect a presumed contact plug region, cannot cover the entire exposed active regions, and thus the active regions are damaged during the etching process.

One can overcome this limitation by using a sufficiently large photoresist film mask to cover the entire active regions of the semiconductor substrate, and increasing the resulting contact plug size by depositing a polymer. However, particles are generated during the polymer depositing process. These particles deteriorate the yield and the operation property of the device. Thus, a cleaning process is often required to maintain the usefulness of the system resulting in increased cost and time.

SUMMARY OF THE INVENTION

Accordingly, it is an object of the present invention to provide a method for fabricating a semiconductor device which can prevent or significantly reduce active regions of a semiconductor substrate from being damaged due to misalignment during a contact plug formation process.

One aspect of the present invention provides a method for fabricating a semiconductor device, comprising the steps of:

producing a semiconductor substrate comprising a MOSFET and a device isolation film;

forming a conductive material layer on said semiconductor substrate;

forming a metallic film on said conductive layer, wherein said metallic film is a metal oxide or a metal nitride film;

forming a photoresist film mask on said metallic film for protecting a presumed region of a bit line contact plug and a storage electrode contact plug;

producing an intermediate mask (e.g., combined elements of 23b and 25 of FIG. 2B) comprising said metallic film using said photoresist film mask;

producing a contact plug mask (e.g., combined elements of 23b, 25 and 27 of FIG. 2C) by coating a polymer comprising a metal on side walls of said intermediate mask;

producing a bit line contact plug and a storage electrode contact plug from said conductive material layer using said contact plug mask; and removing said contact plug mask.

Preferably, the metallic film is selected from the group consisting of $Al_2O_3$, $Ta_2O_5$, and TiN. In one particular embodiment of the present invention, the polymer which is used to coat the side walls of the intermediate mask comprises a corresponding metal. For example, when the metallic film is $Al_2O_5$, $Ta_2O_5$ or TiN, the polymer comprises Al, Ta or Ti, respectively.

Preferably, when the metallic film is $Al_2O_5$ or $Ta_2O_5$, the intermediate mask producing step comprises etching the metallic film using a gas mixture comprising:

(i) a fluorine containing gas;

(ii) a halogen gas or a halogen containing gas;

(iii) oxygen or oxygen containing gas; and (iv) an inert gas.

Preferably, when the metallic film is TiN, the intermediate mask producing step comprises etching the metallic film using a gas mixture comprising:

(i) a halogen gas or a halogen containing gas;

(ii) oxygen or oxygen containing gas; and (iii) an inert gas.

Preferably, the fluorine containing gas is selected from the group consisting of $CF_4$, $C_2F_4$, $C_3F_6$, $C_3F_8$, $C_4F_6$, $C_4F_8$, $C_5F_8$, $CHF_3$, $CH_2F_2$, $CH_3F$, $NF_3$ and $SF_6$.

Preferably, the halogen gas is $Cl_2$.

Preferably, the halogen containing gas is selected from the group consisting of $BCl_3$ and HBr.

Preferably, the oxygen containing gas is selected from the group consisting of $CO_2$, NO and $NO_2$.

Preferably, the inert gas is selected from the group consisting of He, Ne, Ar and Xe.

Preferably, the conductive material is selected from the group consisting of a polysilicon, tungsten and Ti/TiN.

Another aspect of the present invention provides a method for fabricating a semiconductor device, comprising the steps of:

forming a semiconductor substrate comprising a MOSFET and a device isolation film;

forming a conductive material layer on said semiconductor substrate;

forming an $Al_2O_3$ film on said conductive material layer;

forming a photoresist film mask on said conductive material layer for protecting a presumed region of a bit line contact plug and a storage electrode contact plug;

producing an intermediate mask by etching said $Al_2O_3$ film using said photoresist film mask;

producing a contact plug mask by coating a polymer comprising Al on the side walls of said intermediate mask;

producing a bit line contact plug and a storage electrode contact plug by etching said conductive material layer using said contact plug mask; and removing said contact plug mask.

Preferably, the polymer comprising Al is removed using a mixed solution of $HF/NH_4F/DI$ or $H_2SO_4/H_2O_2/DI$. DI means "de-ionized water".

Preferably, the $Al_2O_3$ film is removed using a mixed solution of $H_2SO_4/H_2O_2/DI$.

DETAILED DESCRIPTION OF THE INVENTION

Figure 1:
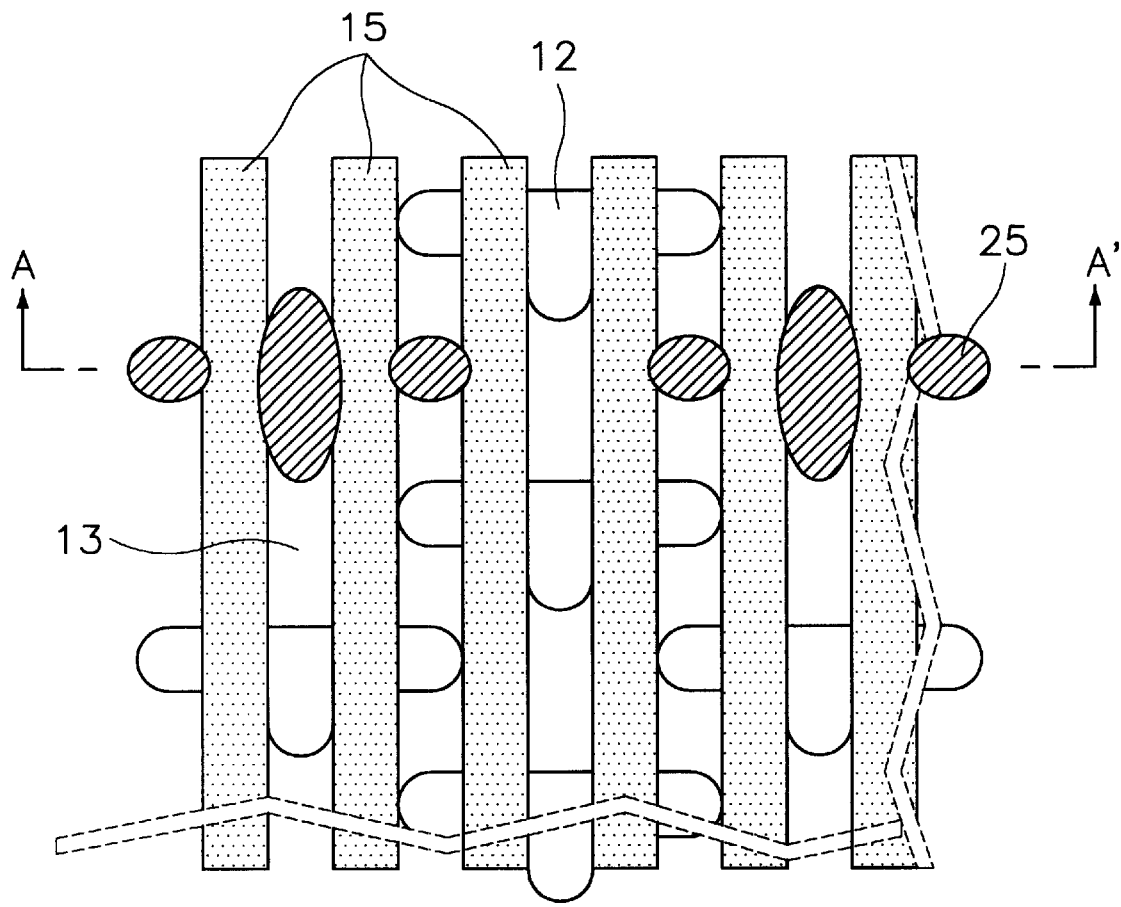
FIG. 1 is a layout diagram illustrating a method for fabricating a semiconductor device in accordance with the present invention.

The present invention will be described with regard to the accompanying drawings which do not constitute limitations on the scope thereof but assist in illustrating various features of the invention. Like numbers in the drawings represent like elements.

As shown in FIG. 1, gate electrodes 15 are formed at a predetermined interval, active regions 12 are formed between the gate electrodes 15, and a photoresist film pattern (i.e., mask) 25 is formed to protect a presumed region of bit line and storage electrode contacts in subsequent processes.

Figure 2A:
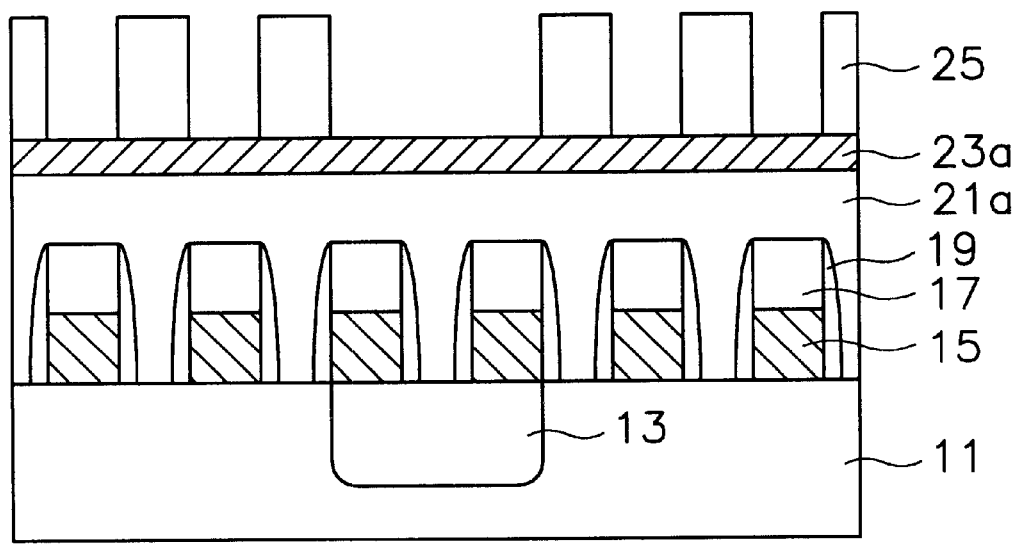
FIGS. 2A through 2D are cross-sectional diagrams illustrating the method for fabricating the semiconductor device, taken along line A–A' in FIG. 1.
Figure 2B:
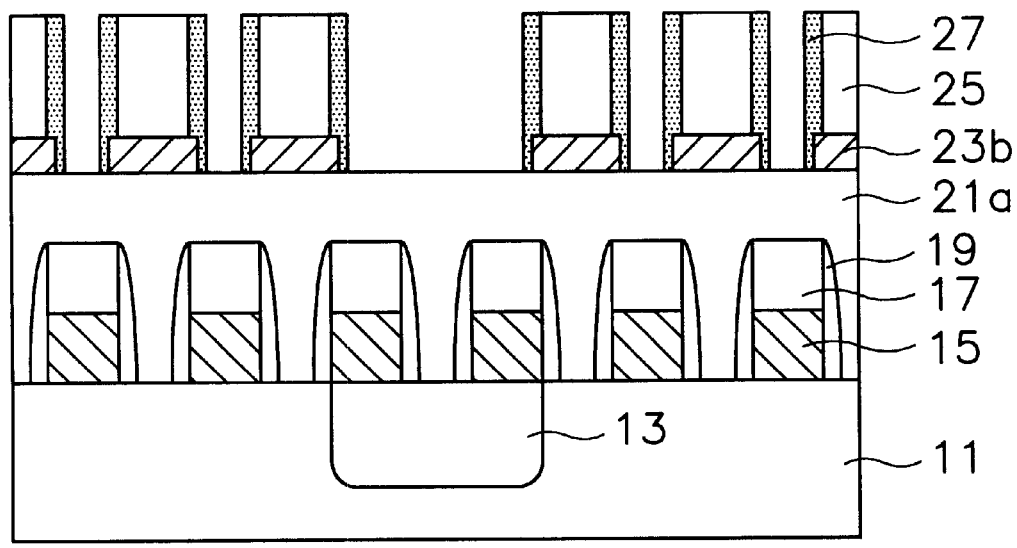
Figure 2C:
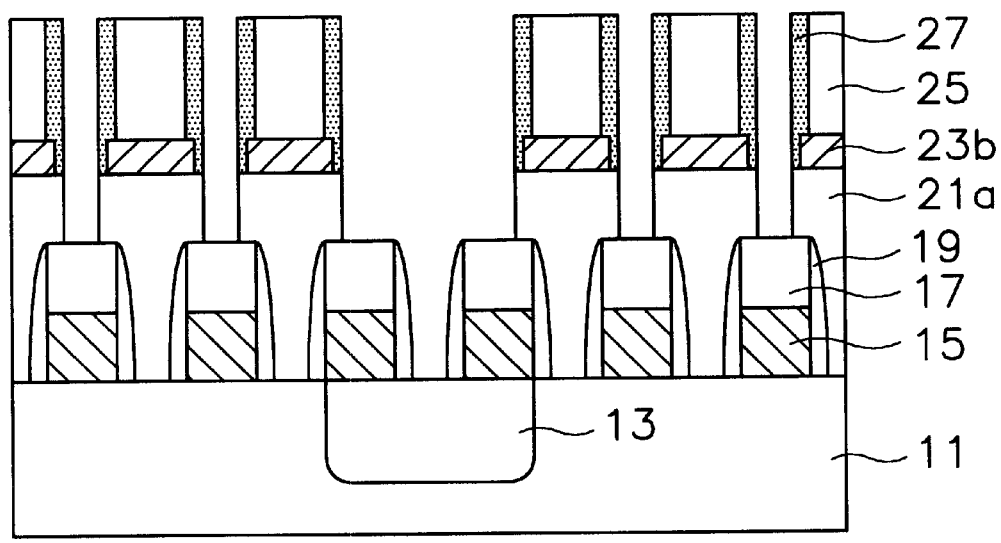

As illustrated in FIG. 2A, a device isolation film 13 is formed at a presumed device isolation region of the semiconductor substrate 11. A gate insulation film (not shown) is formed over the resultant structure. A conductive layer for the gate electrode (not shown) and a mask insulation film (not shown) are formed on the gate insulation film. The structure is then etched using a gate electrode mask (not shown) to produce a mask comprising the gate electrode and mask insulation film, elements 15 and 17 in FIG. 2A, respectively. An insulation film is formed over the resultant structure and etched to form an insulation film spacer 19 at the side walls of the gate electrode 15 and the mask insulation film 17.

Although not illustrated, a lightly doped impurity is ion-implanted into the semiconductor substrate 11 at both sides of the insulation film spacer 19, thereby forming active, i.e., source/drain, regions (not shown). A conductive layer 21a is formed over the resultant structure. An $Al_2O_3$ film 23a is formed on the conductive layer 21a at a substantially predetermined thickness. Preferably, the conductive layer 21a consists of a material selected from the group consisting of a polysilicon, tungsten and Ti/TiN film. Instead of an $Al_2O_3$ film, $Ta_2O_5$ film or TiN film can be used as the metallic film 23a.

The photoresist film mask 25, which is used to protect a presumed region of a bit line contact plug and a storage electrode contact plug, is formed on the $Al_2O_3$ film 23a. And the photoresist film mask 25 is used to form an $Al_2O_3$ mask 23b by etching the $Al_2O_3$ film. The polymer 27 comprising Al is formed at the side walls of the photoresist film mask 25, thereby producing the photoresist film mask 25, which is wider than the contact plug region.

The $Al_2O_3$ film 23a can be etched using a mixed gas which comprises each of (i) a fluorine containing gas, (ii) a halogen gas or a halogen containing gas, (iii) oxygen ($O_2$) or an oxygen containing gas and (iv) an inert gas. Preferably, the fluorine containing gas is selected from the group consisting of $CF_4$, $C_2F_4$, $C_3F_6$, $C_3F_8$, $C_4F_6$, $C_4F_8$, $C_5F_8$, $CHF_3$, $CH_2F_2$, $CH_3F$, $NF_3$ and $SF_6$. Preferably, the halogen gas is $Cl_2$. Preferably, the halogen containing gas is selected from the group consisting of $BCl_3$ and HBr. Preferably, the oxygen containing gas is selected from the group consisting of $CO_2$, NO and $NO_2$. Preferably, the inert gas is selected from the group consisting of He, Ne, Ar and Xe.

When the $Ta_2O$, film is used instead of the $Al_2O_3$ film for element 23a, an etching process of the $Ta_2O_5$ film is carried out by using the mixed gas described above and the side walls of the photoresist film mask 25 is coated with a polymer comprising Ta. And when a TiN film is used instead of the $Al_2O_3$ film for element 23a, the TiN film can be etched using a mixed gas comprising each of (i) a halogen gas or a halogen containing gas, (ii) oxygen or an oxygen containing gas, and (iii) an inert gas, and coating the resulting side walls of the mask with a polymer comprising Ti.

The conductive layer 21a is etched by using the photoresist film pattern 25 and the polymer 27 as a mask to produce a contact plug 21b contacting a presumed region of the bit line contact and the storage electrode contact on the semiconductor substrate 11. Said contact plug 21b is indicating patterned 21a.

Figure 2D:
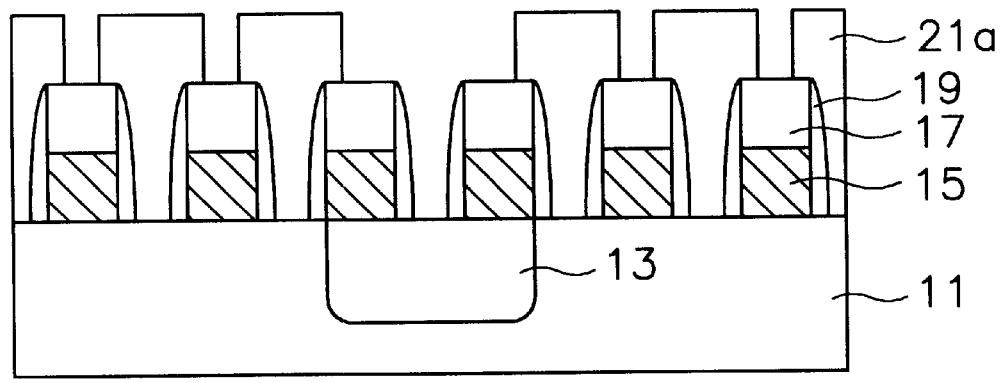

The photoresist film mask 25, polymer 27 and $Al_2O_3$ film pattern 23b are removed. The polymer 27 can be removed using a mixed solution of strong acid, such as $HF/NH_4F/DI$ or $H_2SO_4/H_2O_2/DI$. The $Al_2O_3$ film pattern 23b can be removed using a mixed solution of $H_2SO_4/H_2O_2/DI$. The present method prevents the mask insulation film pattern 17 and insulation film spacers 19 from being damaged (refer to FIG. 2D).

An interlayer insulation film (not shown) is formed over the resultant structure in the subsequent process. An etching process is performed to form a contact hole exposing the presumed region of a bit line and/or the storage electrode on the contact plug 21b.

Preferably, the interlayer insulation film comprises a material which can be etched easily relative to the mask insulation film pattern 17 and the insulation film spacers 19. Preferably, the interlayer insulation film is etched using a fluorocarbon gas which is capable of generating a large amount of polymers, such as $C_2F_6$, $C_2F_4$, $C_3F_6$, $C_3F_8$, $C_4F_6$, $C_4F_8$, $C_5F_8$, $C_5F_{10}$ or $C_2H_4$. Alternatively, the etching process can also be carried out using a gas mixture comprising (i) the fluorocarbon gas, and (ii) hydrogen ($H_2$) or a hydrogen containing gas, such as $CHF_3$, $CH_3F$, $CH_2F_2$, $CH_2$, $CH_4$, and $C_2H_4$. An inert gas such as He, Ne, Ar or Xe can be added to the fluorocarbon gas and the gas mixture, which can improve plasma stability and sputtering effects and reduces or eliminates an etch stop phenomenon, thereby significantly improving the etching process reproducibility.

Still alternatively, the interlayer insulation film can be etched using a $C_xH_yF_z$ gas (where $x \geq 2$, $y \geq 2$, $z \geq 2$). This gas provides a high etching selection ratio difference between the mask insulation film pattern 17 and the insulation film spacers 19. The etching can also be carried out by utilizing a mixture of gas comprising a $C_xH_yF_z$ gas and an inert gas, which are described above.

Methods of the present invention produces the contact plug that is larger than the presumed contact region. As a result, the acceptable process error margin for misalignment is increased, and the property and yield of semiconductor devices are improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalents of such meets and bounds are therefore intended to be embraced by the appended claims.

What is claimed is:

1. A method for fabricating a semiconductor device, comprising the steps of:

provic a semiconductor substrate comprising a MOSFET and a device isolation film;

forming a conductive material layer on the semiconductor substrate;

forming a metallic film on the conductive layer, wherein the metallic film is a metal oxide or a metal nitride film;

forming a photoresist film pattern on the metallic film to cover a predetermined region where a bit line contact plug and a storage electrode contact plug is to be formed;

etching the metallic film using the photoresist film pattern as an etching mask to form a metallic film pattern, wherein the metallic film pattern has a larger width than that of the photoresist film pattern;

forming a polymer comprising a metal on side walls of a stacked structure comprising the metallic film pattern and the photoresist film pattern, the stacked structure and the polymer thereby forming a contact mask;

forming a bit line contact plug and a storage electrode contact plug by etching the conductive layer using the contact plug mask; and removing the contact plug mask.

2. The method of claim 1, wherein the metallic film is selected from the group consisting of $Al_2O_3$, $Ta_2O_5$, and TiN.

3. The method of claim 2, wherein the metallic film is $Al_2O_3$ and the polymer comprises Al.

4. The method of claim 3, wherein the step of etching the metallic film employs a mixture gas comprising: (i) a fluorine containing gas; (ii) a halogen gas or a halogen containing gas; (iii) oxygen or oxygen containing gas; and (iv) an inert gas.

5. The method of claim 4, wherein the fluorine containing gas is selected from the group consisting of $CF_4$, $C_2F_4$, $C_3F_6$, $C_3F_8$, $C_4F_6$, $C_4F_8$, $CHF_3$, $CH_2F_2$, $CH_3F$, $NF_3$ and $SF_6$.

6. The method of claim 4, wherein the halogen gas or the halogen containing gas is selected from the group consisting of $Cl_2$, $BCl_3$ HBr.

7. The method of claim 4, wherein the oxygen containing gas is selected from the group consisting of $CO_2$, NO and $NO_2$.

8. The method of claim 4, wherein the inert gas is selected from the group consisting of He, Ne, Ar and Xe.

9. The method of claim 2, wherein the metallic film is $Ta_2O_5$ film and the polymer comprises Ta.

10. The method of claim 9, wherein the step of etching the metallic film employs a mixture gas comprising: (i) a fluorine containing gas; (ii) a halogen gas or a halogen containing gas; (iii) oxygen or oxygen containing gas; and (iv) an inert gas.

11. The method of claim 2, wherein the metallic film is TiN film and the polymer comprises Ti.

12. The method of claim 11, wherein the step of producing the metallic film employs a mixture gas comprising: (i) a halogen gas or a halogen containing gas; (ii) oxygen or oxygen containing gas; and (iii) an inert gas.

13. The method of claim 1, wherein the conductive layer is selected from the group consisting of a polysilicon, tungsten and Ti/TiN.

14. A method for fabricating a semiconductor device, comprising the steps of:

providing a semiconductor substrate including a MOSFET and a device isolation film;

forming a conductive layer on the semiconductor substrate;

forming an $Al_2O_3$ film on the conductive layer;

forming a photoresist film pattern on the $Al_2O_3$ film to cover a predetermined region where a bit line contact plug and a storage electrode contact plug is to be formed;

etching the $Al_2O_3$ film using the photoresist film pattern as an etching mask to form a $Al_2O_3$ film pattern, wherein the $Al_2O_3$ film pattern has a larger width than that of the photoresist film pattern;

forming a polymer comprising Al on side walls of a stacked structure comprising the $Al_2O_3$ film pattern and the photoresist film pattern, the stacked structure and the polymer thereby forming a contact mask;

forming a bit line contact plug and a storage electrode contact plug by etching the conductive layer using the contact plug mask; and removing the contact plug mask.

15. The method of claim 14, wherein the step of etching the $Al_2O_3$ film employs a mixture gas comprising: (i) a fluorine containing gas; (ii) a halogen gas or a halogen containing gas; (iii) oxygen or oxygen containing gas; and (iv) an inert gas.

16. The method of claim 15, wherein the fluorine containing gas is selected from the group consisting of $CF_4$, $C_2F_4$, $C_3F_6$, $C_3F_8$, $C_4F_6$, $C_4F_8$, $C_5F_8$, $CHF_3$, $CH_2F_2$, $CH_3F$, $NF_3$ and $SF_6$;

the halogen gas or the halogen containing gas is selected from the group consisting of $Cl_2$, $BCl_3$ and HBr;

the oxygen containing gas is selected from the group consisting of $CO_2$, NO and $NO_2$; and the inert gas is selected from the group consisting of He, Ne, Ar and Xe.

17. The method of claim 14, wherein the conductive layer comprises a film selected from the group consisting of a polysilicon, tungsten and Ti/TiN.

18. The method of claim 14, wherein the step of removing the contact plug mask comprises removing polymer using a mixed solution of $HF/NH_4F/DI$ or $H_2SO_4/H_2O_2/DI$.

19. The method of claim 14, wherein the step of removing the contact plug mask comprises removing the $Al_2O_3$ film using a mixed solution of $H_2SO_4/H_2O_2/DI$.

* * * * *